United States Patent
Dabral et al.

[11] Patent Number: 6,137,143
[45] Date of Patent: Oct. 24, 2000

[54] DIODE AND TRANSISTOR DESIGN FOR HIGH SPEED I/O

[75] Inventors: Sanjay Dabral, Milpitas; Krishna Seshan, San Jose, both of Calif.

[73] Assignee: Intel Corporation, Santa Clara, Calif.

[21] Appl. No.: 09/107,351

[22] Filed: Jun. 30, 1998

[51] Int. Cl.$^7$ .................................................. H01L 23/62
[52] U.S. Cl. ........................ 257/355; 257/328; 257/355; 257/356; 257/357; 257/358; 257/359
[58] Field of Search .................................. 257/328, 357, 257/358, 359, 355, 356

[56] References Cited

U.S. PATENT DOCUMENTS

| | | | |
|---|---|---|---|
| 5,272,097 | 12/1993 | Shiota | 437/34 |
| 5,432,368 | 7/1995 | Jimenez | 257/355 |
| 5,449,940 | 9/1995 | Hirata | 257/360 |
| 5,596,216 | 1/1997 | Yanagigawa | 257/355 |
| 5,835,986 | 11/1998 | Wei et al. | 257/360 |
| 5,844,282 | 12/1998 | Noguchi | 257/356 |
| 5,856,694 | 1/1999 | Kurachi | 257/360 |
| 5,886,381 | 3/1999 | Frisina | 257/328 |
| 5,900,664 | 5/1999 | En | 257/356 |
| 5,910,677 | 6/1999 | Irino | 257/393 |
| 5,936,282 | 8/1999 | Baba et al. | 257/355 |
| 5,962,902 | 10/1999 | Kato et al. | 257/372 |

FOREIGN PATENT DOCUMENTS

| | | | |
|---|---|---|---|
| 402231734 | 9/1990 | Japan | 257/356 |
| 403046273 | 2/1991 | Japan | 257/356 |
| 404111363 | 2/1991 | Japan | 257/357 |
| 406021324 | 1/1994 | Japan | 257/357 |
| 406151900 | 5/1994 | Japan | 257/356 |

*Primary Examiner*—David Hardy
*Assistant Examiner*—Edgardo Ortiz
*Attorney, Agent, or Firm*—Blakely, Sokoloff, Taylor & Zafman LLP

[57] ABSTRACT

An integrated circuit including a performance circuit occupying a first area of an integrated circuit substrate and a protection circuit coupled to the performance circuit and occupying a second area of an integrated circuit substrate separate from the first area. Also, a method of forming an integrated circuit including the steps of: Forming a performance circuit occupying a first area of an integrated circuit substrate, forming a protection circuit occupying a second area of an integrated circuit separate from the first area, and coupling the protection circuit to the performance circuit.

19 Claims, 8 Drawing Sheets

DIODE AND TRANSISTOR DESIGN FOR HIGH SPEED I/O

BACKGROUND OF THE INVENTION

1. Field of the Invention

The invention relates to integrated circuit devices and more particularly to layout techniques for such devices.

2. Description of Related Art

One area where parasitic capacitance is noted is in input/output (I/O) buffer circuits. For high speed I/O circuits, the parasitic capacitance is one limiter to the fast transitioning edges of the circuit. The larger the capacitance, the slower the charging or discharging, resulting in degraded bus performance. Thus, many efforts have been put forth to reduce the capacitive load and create faster transitions which in turn leads to faster I/O circuits.

The input signals to an integrated circuit, for example, a metal oxide semiconductor (MOS) integrated circuit, are generally fed to transistors. If the voltage applied to the transistor becomes excessive, the gate oxide can break down, the junctions can be destroyed, and the metal to the transistor can be destroyed. Excessive voltages are voltages in excess of the normal operating voltages of the circuit. For example, voltages far in excess of the nominal operating voltage of an integrated circuit, may be impressed upon the inputs to the circuit during either human-operator or mechanical handling operations.

The main source of excessive high voltages to integrated circuits is triboelectricity. Triboelectricity is caused when two materials are rubbed together. A common situation is a person developing very high static voltage (i.e., a few hundred to a few thousand volts) simply by walking across a room or by removing an integrated circuit from its plastic package, even when careful handling procedures are followed. If such a high voltage is applied to the pins of an integrated circuit package, its discharge, referred to as ElectroStatic Discharge (ESD), can cause breakdown of the devices to which the voltage is applied. The breakdown event may cause sufficient damage to produce immediate destruction of the integrated circuit, or it may weaken the device enough that it will fail early in the operating life of the integrated circuit.

In general, all inputs (e.g., pins) of MOS integrated circuits are provided with protection circuits to prevent excessive voltages from damaging the MOS transistors. These protection circuits are normally placed at the input and output pads on a chip and the transistor gates to which the pads are connected. The protection circuits are designed to begin conducting or to undergo breakdown, thereby providing an electrical path to ground (or to the power-supply rail), in the presence of excessive voltages, generally ESD. Since the breakdown mechanism is designed to be non-destructive, the circuits provide a normally open path that closes only when a high voltage appears at the input or output terminals, harmlessly discharging the node to which it is connected.

Typically, two types of protection circuits are used to provide protection against ESD damage: Diode breakdown and diode conduction. Diode protection is obtained by using the diode-breakdown or diode-conduction phenomenon to provide an electrical path in the semiconductor, e.g., silicon, substrate that consists of a diffused diode region of a doping type opposite to that of the substrate (for example, p-type and n-type doping, respectively). This diffused region is connected between the input pad and substrate. If a reverse-bias voltage greater than the breakdown voltage of the resultant pn junction is applied, the diffusion region (which otherwise works as a diode) undergoes breakdown. Furthermore, the diffused region will also clamp a negative-going ESD transition at the chip input to one diode drop below the substrate voltage. In CMOS technologies, an additional protection diode can be added by utilizing the pn junction that exists between a p-type region and the body region of the PMOS device (an n-type region that is connected to $V_{CC}$). This diode is utilized as a protection device when a connection is made between the pad and a p-type region. This diode will generally clamp positive-going transitions to one diode drop above $V_{CC}$ ($V_{CC}$ is generally 0V during ESD).

FIG. 1 shows a known input/output (I/O) buffer circuit 10 having ESD protection components, diodes D1 and D2. CMOS I/O buffer circuit 10 includes PMOS device 20 coupled to NMOS devices 30. The devices of circuit 10 are connected to I/O pad 40. Between pad 40 and the devices is a negative zap protection diode D1. Between I/O pad 40 and PMOS circuit 20 is forward-biased protection diode D2.

Figure 1A:
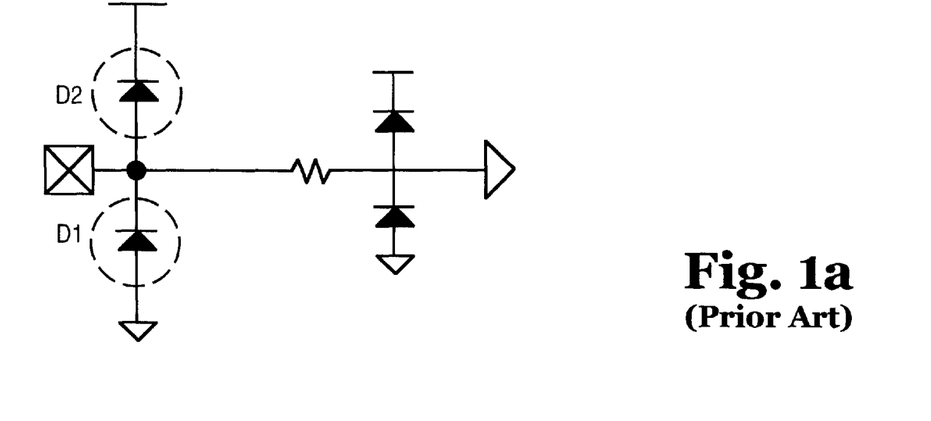
FIG. 1 is a typical I/O scheme having ESD protection components.
Figure 1B:
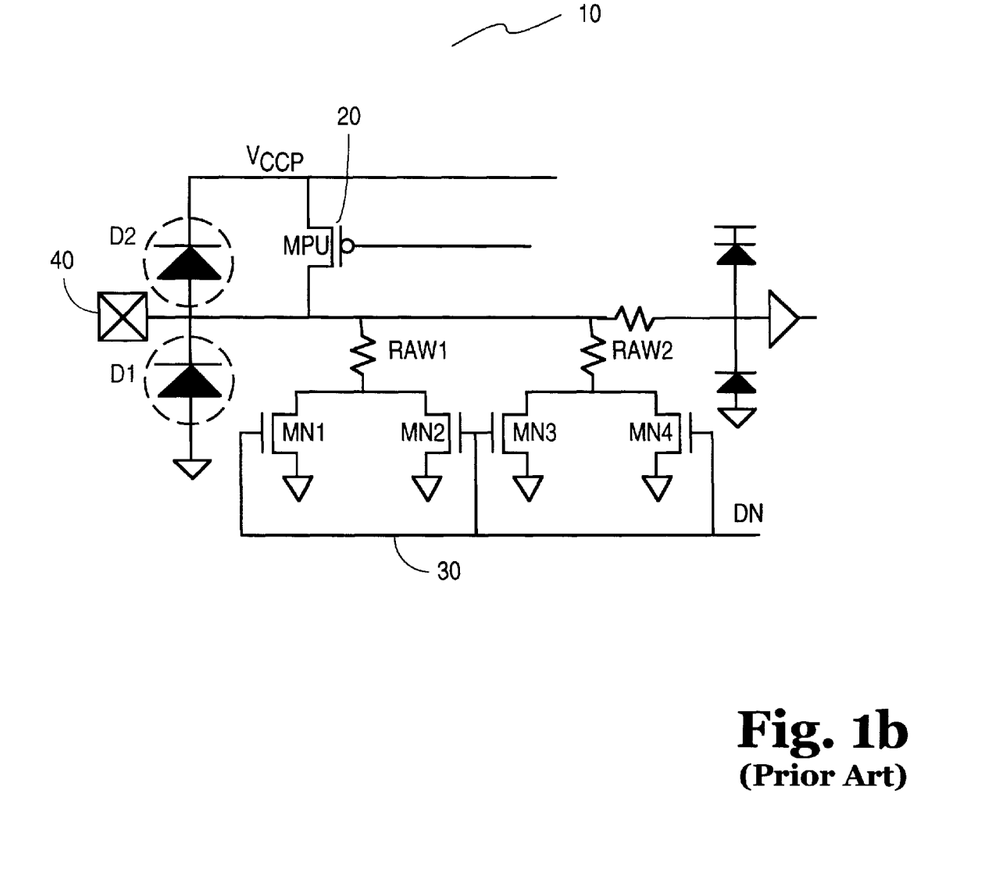
Figure 2:
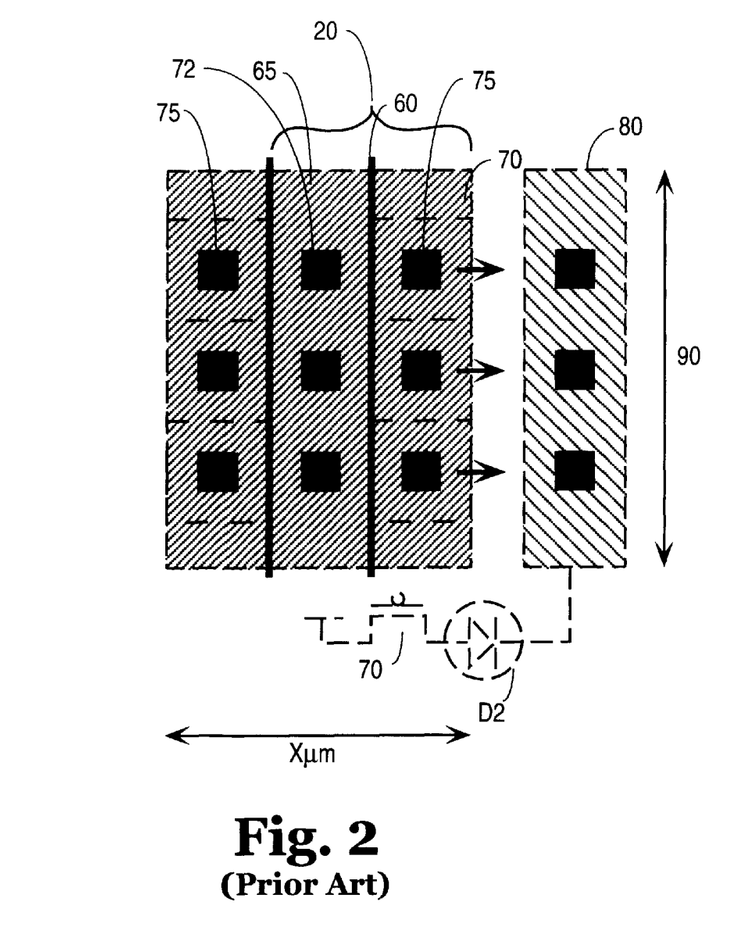
FIG. 2 shows a circuit layout of an ESD diode integrated with a PMOS device with a shared p-type area acting as a MOSFET drain and a diode anode.

FIG. 2 shows a prior art layout of a portion of I/O buffer circuit 10 of FIG. 1, specifically illustrating the layout of PMOS device 20 and ESD protection diode D2. FIG. 2 shows PMOS field effect transistor (MOSFET) device 20 made up of polysilicon gate 60 separating source region 65 and drain region 70 with individual contacts 72 and 75 to source and drain regions 65 and 70, respectively. In this embodiment, PMOS device 20 is in an n-well with p-type ($p^+$ doped) source and drain regions 65 and 70, respectively. FIG. 2 also shows conventional PMOS diode D2 adjacent drain 70 of PMOS device 20. In FIG. 2, p-type area 70 acts as both a MOSFET drain 70 and the D2 diode anode. Adjacent drain/anode 70 is an n-type ($n^+$-doped) cathode region 80 in the n-well.

The critical size of a protection circuit and of a performance circuit are independent of one another. For example, protection diodes D1 and D2 are sized (i.e., a specific volume of semiconductor material allocated) in accordance with the amount of charge that is contemplated to be dissipated. If the power is dissipated into too small a volume of silicon, the silicon can be heated beyond its melting point and the device destroyed. Transistor devices 20 and 30 are likewise sized, for example, in accordance with the voltage drive capabilities of the output driver.

In typical prior art structures, such as the I/O scheme illustrated in FIGS. 1 and 2, the size of PMOS protection D2 diode corresponds to the size of the PMOS device because they share a common junction (drain or anode). To accommodate layout concerns and processing conveniences, D2 diode is integrated with PMOS device 20. In other words, the critical size of either D2 diode or PMOS device 20 determines the size of the corresponding device. If D2 diode size is critical and controls, PMOS device 20 size is enlarged to accommodate the large diode. If, on the other hand, PMOS device 20 is critical and controls, D2 diode size is enlarged beyond what is necessary for an ESD protection circuit. It is to be appreciated that techniques for determining a critical diode size for addressing ESD concerns are well known and, so as not to obscure the invention, will not be discussed herein. For purposes of the invention, it is necessary to understand only that there is a critical, scaleable minimum size, for example, a minimum sized D2 diode, that will protect a performance circuit, such as a PMOS device or NMOS device, from ESD damage. Similarly, it is well known in the art how to size performance circuits, such as PMOS drivers. Accordingly, techniques for sizing performance circuits will not be presented herein.

I/O circuit 10 pad capacitance has several elements, including the NMOS device, the PMOS device, the wire bond or C4 pad, the pad to $V_{CCP}$ diode (D2) and the $V_{SS}$ to pad diode (D1). The diffusion capacitance is high because it is a p$^+$-type diffusion in an n-type well. As noted above, the typical PMOS device 20 of an I/O circuit includes a D2 diode, where one edge of the p-type drain serves as the drain and the other as the diode anode or edge. This sharing makes the diode scale up or down with PMOS device 20 size. For example, in a mixed voltage environment, when a high voltage technology wants to drive a low voltage I/O, PMOS device 20 size can be very large. Therefore, D2 diode size is much larger than required resulting in extra capacitive loading.

On the other hand, there are also performance circuits that do not need a large PMOS pull-up device. One example is an open drain buffer. To meet the minimum diode size requirement, however, the PMOS size is increased (and generally tied off).

Increasing the size of either the MOSFET device or the ESD protection circuit, e.g., diode, directly leads to increased capacitance. In general, the size of a device (e.g., area, volume, etc.) is directly related to its parasitic capacitance. Thus, what is needed is a layout, particularly an I/O layout, that minimizes parasitic capacitance contributed by the performance and protection circuits without sacrificing the required actions of either circuit.

SUMMARY OF THE INVENTION

An integrated circuit is disclosed. The integrated circuit includes a performance circuit occupying a first area of an integrated circuit substrate and a protection circuit coupled to the performance circuit commensurate with dissipating an amount of predetermined charge incident on the performance circuit and occupying a second area of an integrated circuit substrate separate from the first area.

Additional features and benefits of the invention will become apparent from the detailed description, figures, and claims set forth below.

DETAILED DESCRIPTION OF THE INVENTION

The invention relates to an integrated circuit and a method of forming an integrated circuit having a performance circuit occupying a first area of an integrated circuit substrate, and a protection circuit coupled to the performance circuit and occupying a second area of the integrated circuit substrate separate from the first area. The partitioning of the performance circuit and protection circuit is scaleable to different device circuit requirements and may be utilized wherever a protection circuit is used to prevent ESD from causing breakdown of integrated circuit devices. The partitioned performance circuit and protection circuit can be utilized in I/O circuits with the objective of maximizing the protection circuit current capability and minimizing the total capacitance at the I/O circuit pad.

The following detailed description describes an improved circuit and a method of forming an improved circuit such as an I/O unit similar to the circuits described with reference to FIGS. 2, 1(a), and 1(b) and the accompanying text. More particularly, the following description relates to a PMOS device and the D2 ESD diode protection circuit for the PMOS device. It is to be appreciated, however, that the invention is not to be limited to I/O circuits or more specifically to PMOS/ESD circuits or CMOS performance circuits and diode protection circuits. Instead, the invention will apply anywhere ESD protection circuits are implemented and the objective is to increase the current capability of the protection circuit and decrease the capacitance of the performance circuit.

Figure 3:
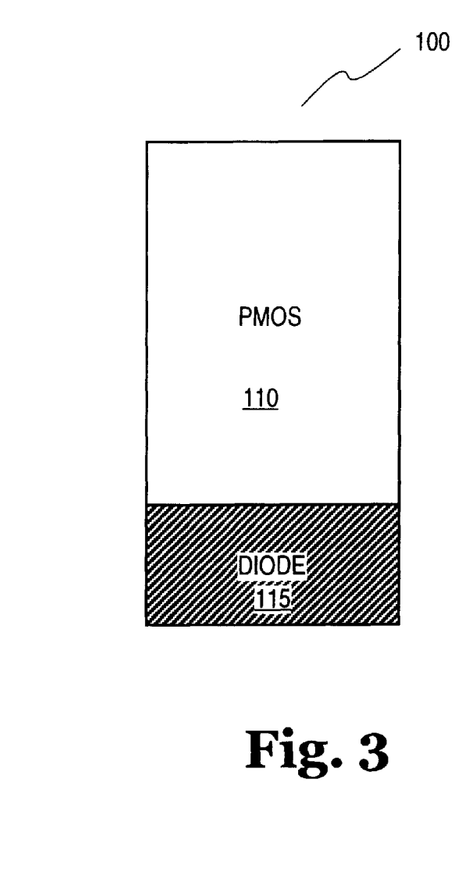
FIG. 3 schematically illustrates the layout of a PMOS device partitioned from its ESD protection diode in accordance with an embodiment of the invention.

FIG. 3 illustrates an embodiment of the invention where the ESD protection circuit is partitioned from the performance circuit. In this example, the performance circuit is, for example, PMOS device 110 of a CMOS I/O circuit in an n-well. ESD protection circuit is, for example, D2 diode 115.

As illustrated in FIG. 3, the invention contemplates that the protection circuit, such as for example, ESD diode 115, is separate from the performance circuit, in this case PMOS device 110 in terms of area or volume utilization of a semiconductor substrate. In the case of D2 diode 115, D2 diode 115 is partitioned from PMOS device 110. The drain region of PMOS device 110 and the anode of D2 diode 115 are not formed of a common doped area of the substrate, such as was described in FIG. 2 and the accompanying text.

The partitioning of D2 diode 115 from PMOS device 110 ensures the best utilization of integrated circuit space. The partitioning allows PMOS device 110 to be scaled up or down while maintaining D2 diode 115 at, for example, the ESD critical size. The partitioning reduces the capacitance (due to the reduction in excess area of either D2 diode 115 or PMOS device 110) while retaining the ESD current handling capability over a standard PMOS driver and ESD protection D2 diode 115. The reduction in capacitance leads to faster transition times, enhancing bus speed. In addition, correctly sized and improved protection circuits (e.g., ESD diodes) and performance circuits (e.g., PMOS drivers) result in an on-chip area reduction when compared to prior art devices.

Comparisons have been made between the partitioned performance/protection circuits and prior art coupled circuits. In one embodiment, a partitioned bimodal driver having a large PMOS device yields an estimated 22% gain in capacitance reduction over a prior art driver coupled bimodal driver. In that same embodiment, the partitioned driver decreases the area for both the performance circuit and protection circuit by an estimated 22%. If a D2 diode size equal to that of an input buffer (e.g., input D2 diode) is used in the output (PMOS) section, the capacitance will see an estimated 36% capacitance reduction gain, and a 37% area reduction.

The above discussion illustrates how the capacitance and required area of an I/O driver with protection circuits are reduced by de-coupling or partitioning the protection circuit from the performance circuit. In addition to this reduction, the invention also contemplates that, in the case of a D2 diode, in particular, the current discharge capability of a diode can be enhanced. This allows a smaller diode to be used while maintaining the critical current discharging requirements necessary for an ESD protection circuit.

Figure 4:
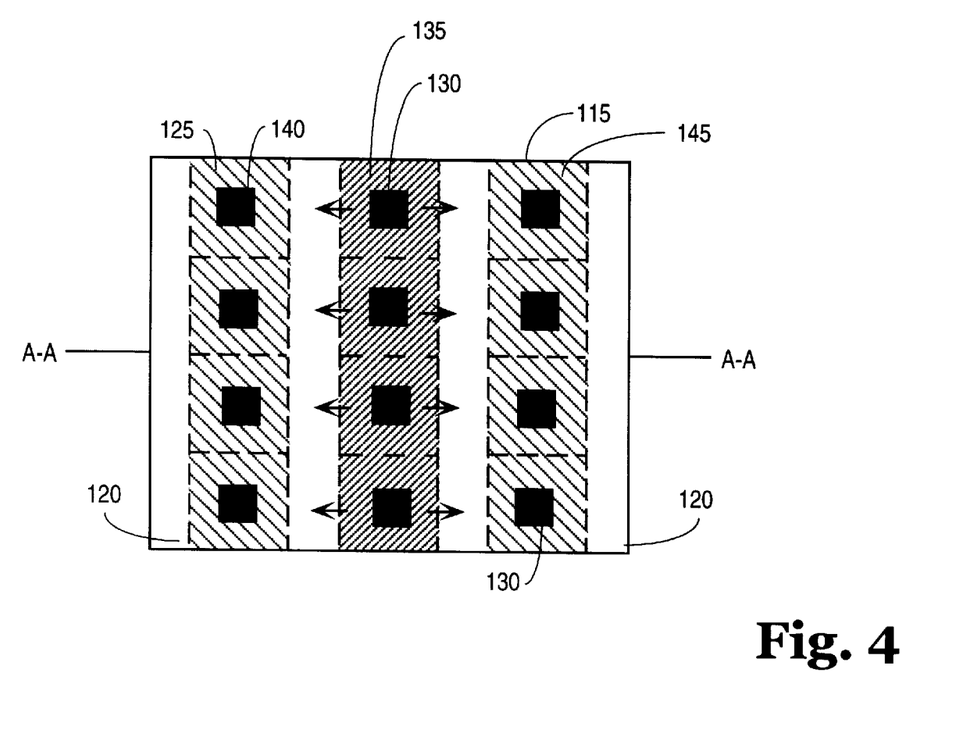
FIG. 4 schematically illustrates the layout of one embodiment of the diode portion of a partitioned integrated circuit in accordance with the invention.
Figure 5:
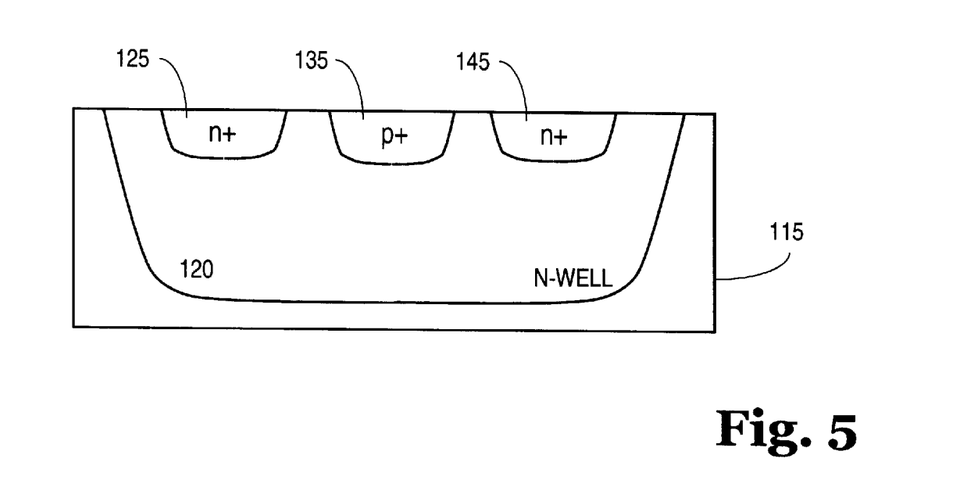
FIG. 5 schematically illustrates a cross-sectional side view of the diode through line A—A of FIG. 4 in accordance with an embodiment of the invention.

FIG. 4 illustrates a layout of partitioned D2 diode 115. Partitioned D2 diode 115 is formed, for example, in an n-type well 120 with n-type doped area regions 125 and 145 serving as cathodes adjacent a p-type doped region 135 anode. Contacts 130 are made to n-type area regions 125 and 145 to, for example, dissipate any charge to a suitable power supply. Similarly, contacts 140 are made to p-type region 135 to, for example, link the diode to the performance circuit. FIG. 4 shows p-type area 135 illustratively represented as a plurality of unit cells, each unit cell represented by a contact 130 to the p-type area 135. A unit cell is the minimum area necessary to place a contact in a minimum area, e.g., a minimum p-type area. FIG. 5 shows a cross-sectional side view taken through line A—A of FIG. 4. This formation of unit cells of lateral stripes 125 and 145 adjacent lateral stripe 135 is referred to herein as a "striped" design.

As illustrated by the arrows in FIG. 4, when ESD diode 115 discharges an ESD current, the current travels laterally (as indicated by the arrows) toward two edges of each p-type unit cell of an area 135. In diode conduction, the periphery or edges of the unit cell contribute more to current dissipation than the area. Thus, the periphery to area ratio as a measurement of p-type each unit cell of area 135 to dissipate charge toward the cathode is limited to two edges of each unit, i.e., ⅔ or ½ of the periphery of each unit cell is available.

Figure 6:
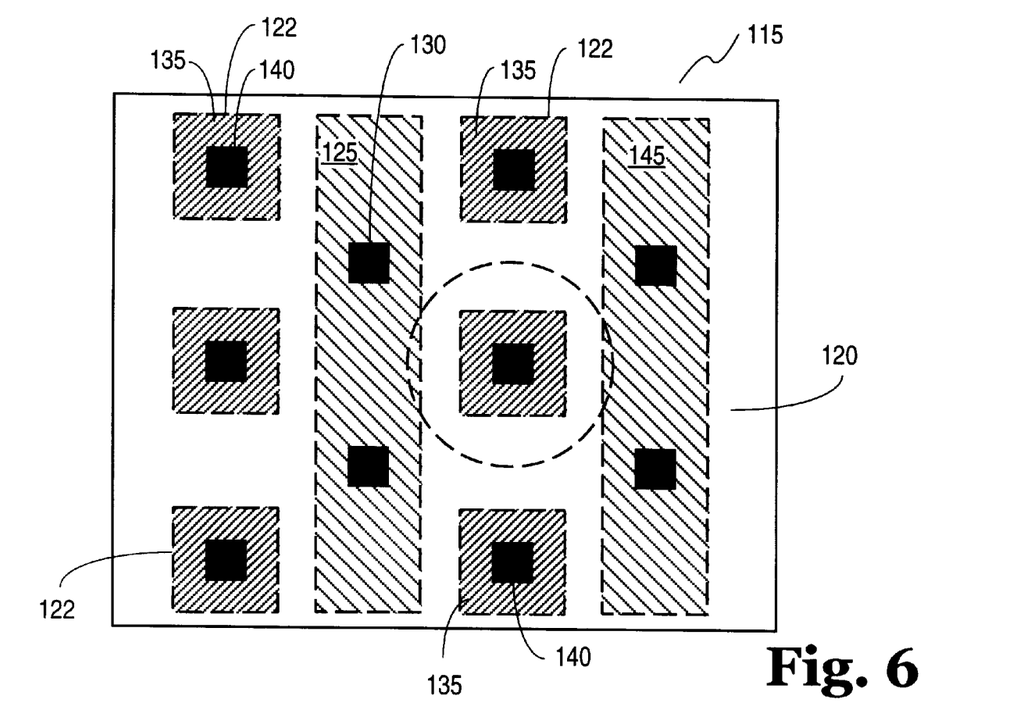
FIG. 6 schematically illustrates a layout of a second embodiment of the diode portion of a partitioned integrated circuit in accordance with the invention wherein the ratio of the periphery to the area of the anode is increased.
Figure 7:
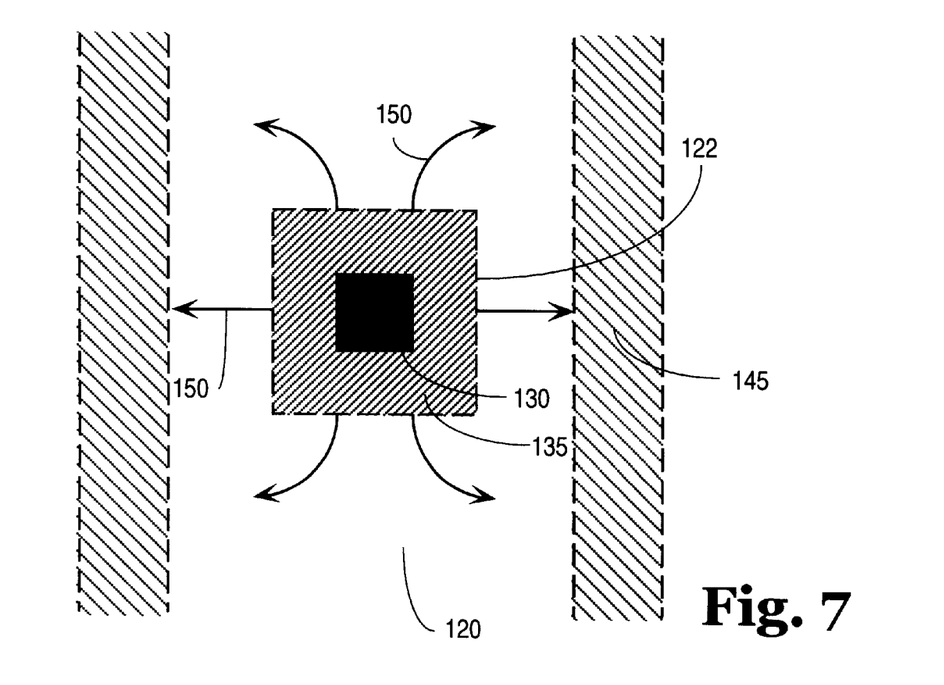
FIG. 7 schematically illustrates an individual p-type anode of FIG. 6 and shows the distribution of current through the anode in accordance with the embodiment of the invention.

The invention contemplates, that in addition to the structure shown in FIGS. 4 and 5, the p-type unit cells of the diode may be made as islands. FIG. 6 shows one such island configuration. In FIG. 6, unit cells 122 of p-type doped area region 135 are formed in n-well 120 and are located adjacent stripes of n-type regions 125 and 145. Each unit cell 122 contains a contact 130. This formation of unit cell 122 adjacent lateral stripes 135 is referred to herein as an "island" design. FIG. 7 illustrates a top view of a single unit cell 122 taken from the diode layout of FIG. 6. Unit cell 122 sits in n-well region 120 separated from stripes of n-type regions 125 and 145 adjacent to the opposing sides of unit cell 122. In this manner, current paths forming along unit cell 122 sides substantially parallel to n-type stripes 125 and 145 have a direct path toward the n-type stripes, much like the prior art diode structures. In addition, since the edges of unit cell 122 that are orthogonal or substantially perpendicular to stripes 125 and 145 are adjacent n-well 120, current 150 can travel through these edges toward stripes 125 and 145 improving the discharge capability of unit cell 122 over the unit cells described with reference to FIGS. 4 and 5. As can be seen in FIG. 7, by creating unit cell 122 as an island, the p-type area region can dissipate charge in four directions.

In the condition where the p-type/n-well diode is strongly forward biased, on the order of 0.8V, a conductivity modulation occurs in n-well 120. During conductivity modulation, there is sufficient hole injection into n-well 120 that even the electrons in n-well 120 exceed the doping density (electrons increase to maintain charge neutrality). Thus, the resistivity of n-well 120 falls dramatically at high conduction, thereby allowing all sides of unit cell 122 to conduct almost uniformly. In such cases, from a geometrical consideration, each unit cell 122 has at least four times the advantage over a diode shared as a drain as in prior art structures (FIG. 2 and the accompanying text), or twice the advantage over a striped diode using both edges as described with reference to the embodiment of the invention described in FIGS. 4 and 5 and the accompanying text.

Figure 8:
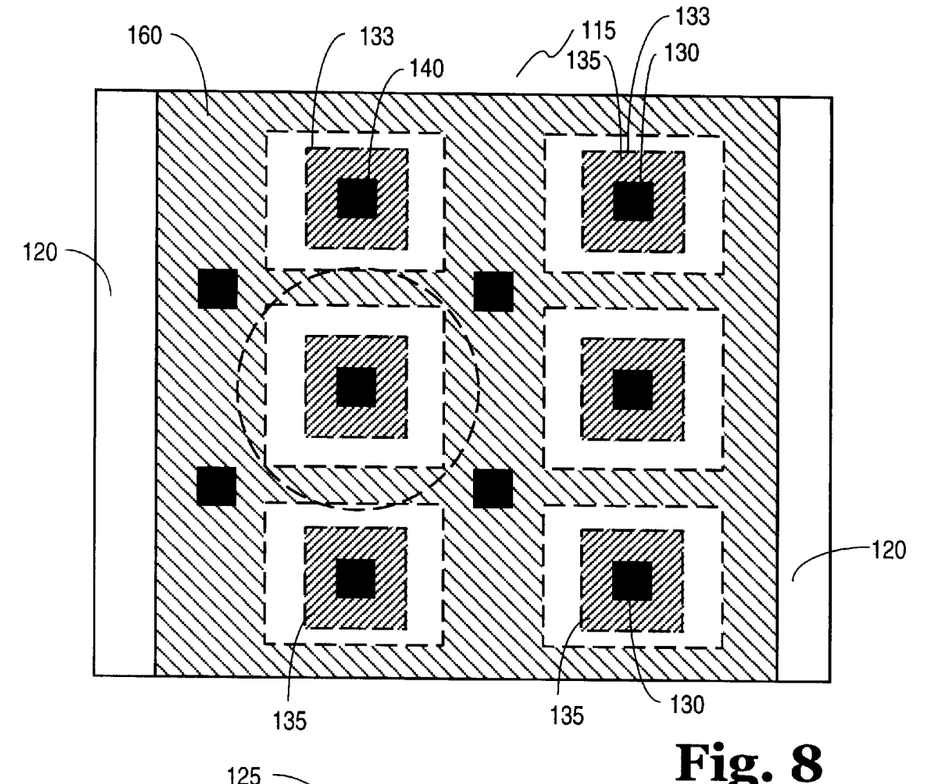
FIG. 8 schematically illustrates a layout of a third embodiment of the diode portion of a partitioned integrated circuit in accordance with an embodiment of the invention wherein an n-type area faces each face of individual p-type anodes.
Figure 9:
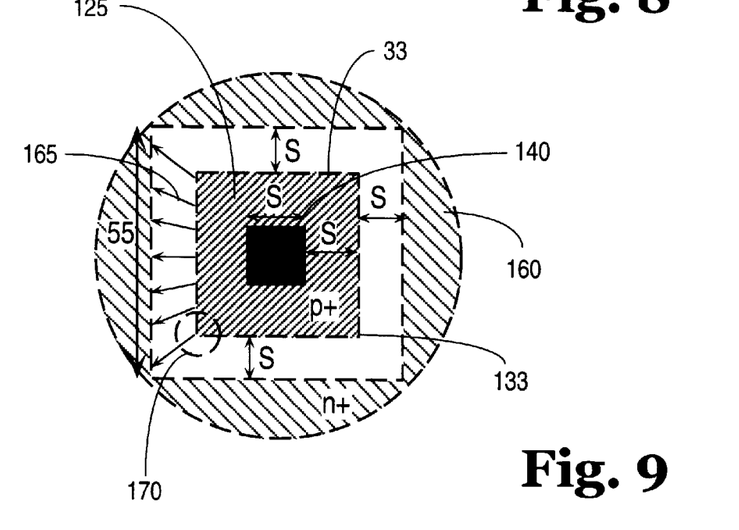
FIG. 9 schematically illustrates a single p-type anode of FIG. 8 and illustrates the current spreading for this type of structure in accordance with an embodiment of the invention.

If higher current uniformity is desired, FIGS. 8 and 9 illustrate a third embodiment of the partitioned protection circuit of the invention. In FIG. 8, unit cells 133 of p-type doped regions 133 are formed in n-well 120. p-type regions 160 are formed adjacent each edge of p-type units 133. In this manner, each unit cell 133 becomes an island in n-well 120 surrounded by n-type region 160. This surrounding of unit cell 133 with n-type region 160 is referred to herein as a "waffle" design.

FIG. 9 shows the current paths 165 from an edge of one unit cell 133 of FIG. 8. The current spreading improves the diode resistance over prior art diode structures. Resistance can be estimated and compared based on the length of the current path. Current path 165 has a trapezoidal shape, and the effective width of the path can be estimated as the average of the widths of the current source and sink. In FIG. 9, the current source has width "3S" and sink width "5S." The diode resistance is reduced by current spreading, spreading a distance "4S." Therefore, the resistive improvement with respect to a linear diode stripe implementation is about "1S/3S", or 33%.

A comparison between a prior art coupled bimodal driver and an embodiment of a decoupled bimodal driver with improved unit cell diode design of the invention has been made. The decoupling and improved unit cell diode reduces the capacitance of the bimodal driver by an estimated 34% and reduces the area by an estimated 27% for the waffle diode configuration of the invention compared to the integrated diode of the prior art.

Comparing the island diode presented in FIGS. 6 and 7 to the waffle diode presented in FIGS. 8 and 9, one estimate is that the waffle diode occupies approximately half the area of the striped diode with other factors remaining the same. The capacitance savings is calculated at about 34%.

The prior art has reported enhanced conduction at the corners of a unit cell of, for example, an anode area stripe such as described with reference to FIG. 2 and the accompanying text. In S. H. Voldman, V. P. Gross, M. J. Hargrove, J. M. Never, J. A. Slinkman, M. P. O'Boyle, T. S. Scott, J. D. Deleckl, "Shallow Trench Isolation Double Diode Electrostatic Discharge Circuit and Interaction With DRAM Output Circuits," Proc. EOS/ESD Symp. 1992, at page 277, and S. H. Voldman, "ESD Protection In A Mixed Voltage Interface and Multirail Disconnected Power Grid Environment in 0.5 μm and 0.25 μm Channel Length CMOS Technology," Proc. EOS/ESD Simp., 1994 at 253, the authors report up to 56% higher currents were observed at the ends or corners compared to a length edge of a diode. In those cases, the enhanced conduction at the corner led to diode destruction, because of uneven current sharing between the length edge and the corners leading to higher temperature at the corners. This enhanced conduction was explained as a three-dimensional implant effect where the junction at the corner becomes cylindrical, as opposed to planar over a straight edge for a trench isolated technology. For a Local Oxidation of Silicon (LOCOS) technology, the junction shapes are spherical at the corner and cylindrical at the straight edge).

Figure 10A:
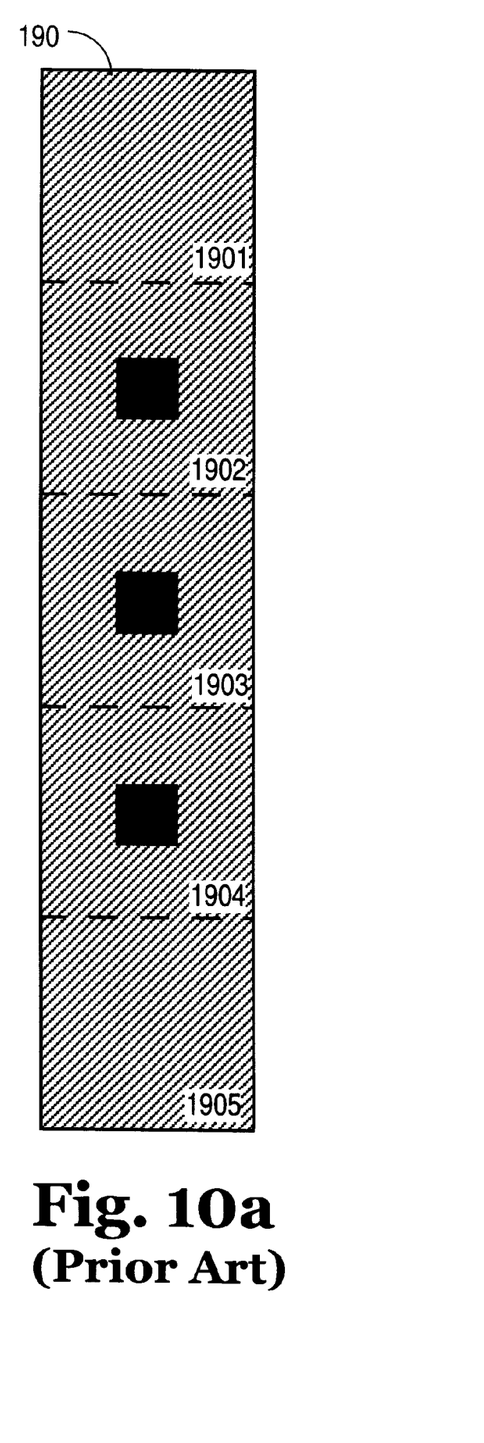
FIG. 10(a) schematically illustrates a layout of a prior art anode stripe having contacts removed from viable areas for unit cells of the anode.

The solution to the problem proposed by the prior art was to eliminate the unit cell at or near the corners, thus reducing the current conduction at the corners. This could be done, for example, by removing the contacts near the ends of, for example, an anode area stripe, as shown in FIG. 10(a). FIG. 10(a) shows anode stripe 190 having unit cells 1902, 1903, and 1904. In areas 1901 and 1905, contacts are not placed and viable areas for unit cells are not utilized and a capacitance penalty is paid.

Figure 10B:
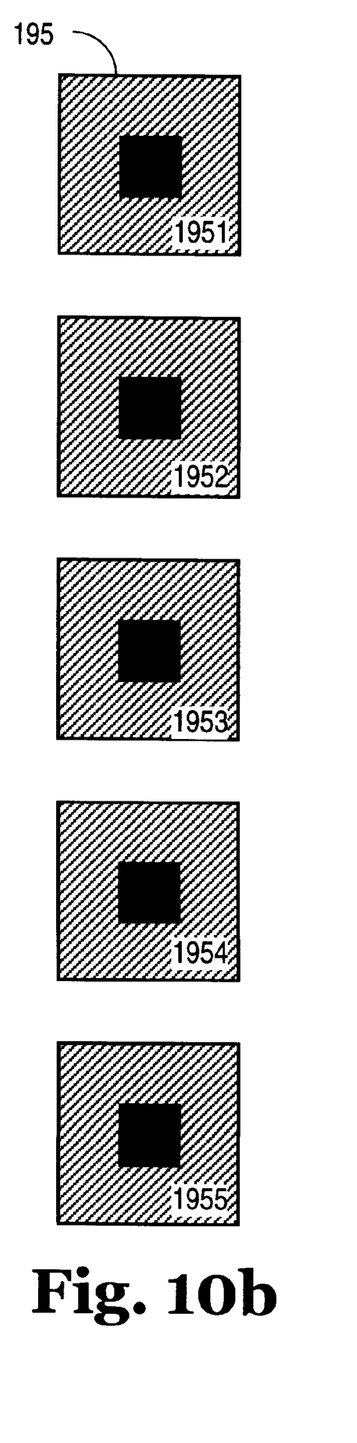
FIG. 10(b) schematically illustrates a layout of an improved anode design in accordance with an embodiment of the invention showing a maximization of periphery in a given area.

In contrast to the prior art teachings, particularly the teachings of Voldman, et al. noted above, the invention contemplates that the diode consists entirely of corners, with very short straight segments. This is shown in FIG. 10(b) in the contrasting structure of anode area 195 in accordance with an embodiment of the invention. In FIG. 10(b), each unit cell 1951–1955 is a diode made up of a multitude (4) of only corners. Therefore, uneven current distribution will not occur. The overall diode performance will be biased toward the enhanced conduction mode and the "problem" recognized by the prior art of enhanced conduction is turned into a beneficial gain.

The p-type to n-well diode is a common ESD protection device employed in many input and input/output pads, including CMOS, mixed voltage, etc. By partitioning the diode and the I/O circuit, and also enhancing the current capability of the diode itself, the area of the semiconductor substrate is significantly reduced and the capacitive load on an I/O pad and on a bus is significantly reduced. The reduction in the capacitive load enhances speed and, to a smaller degree, saves system power. The enhanced current capability of the island and waffle unit cell diodes also reduce the resistance which helps to protect the I/O circuit during an ESD occurrence. Similar area, capacitance, and resistance improvements can be achieved by applying similar principles to other performance/protection circuit, including, in this case, the $V_{SS}$ to pad D1 diode. With regard to the D1 diode, for example, the partitioning and unit cell designs apply equally as well. In the case of implementing the D1 diode in a p-type epitaxial substrate, the D1 diode need not be in a well, but can be made simply by placing an n-type tap or region in the substrate and forming a contact to the tap. It is also to be appreciated that, although logic families conventionally use p-type epitaxial substrates, if another type of substrate, e.g., an n-type substrate, is used, the construction of the D1 and D2 diodes can be suitably adjusted.

Much of the above discussion has focused on optimizing the partitioned diode portion of an I/O circuit. In much the same way, the performance portion of the I/O circuit can similarly be enhanced. As shown in FIG. 2, a prior art PMOS driver 20 utilizes one edge of drain 70 of a MOSFET for transistor action and the other for creating an ESD diode. Each contact 75 to drain region 70 to define a unit cell has a width W and a capacitance C.

Figure 11:
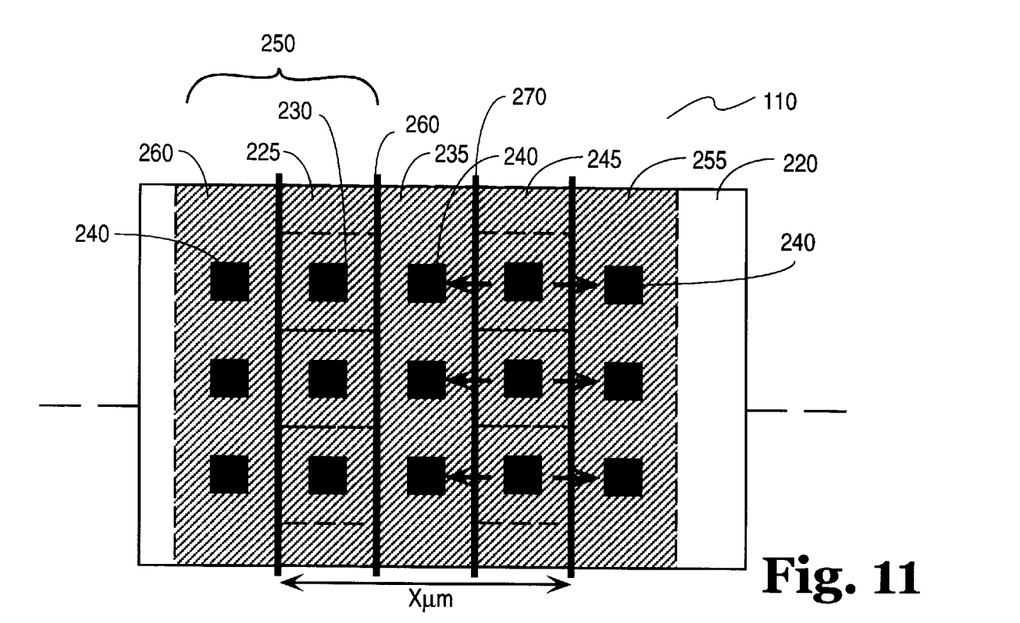
FIG. 11 schematically illustrates a layout of an embodiment of a performance circuit of a partitioned integrated circuit in accordance with the invention.

FIG. 11 shows a top view of a portion of the partitioned performance circuit in accordance with one embodiment of the invention. FIG. 11 shows a PMOS device 250 in an n-well 220. PMOS device 250 includes polysilicon gate 260 between source region 235 and drain region 225. Adjacent drain region 225 opposite the edge adjacent source region 235 is second source region 260. Similarly, polysilicon gate 270 overlies a semiconductor substrate having p-type doped source region 235 and drain region 245. Adjacent the edge of drain region 245 opposite source region 235 is a second source region 255. Drain regions 225 and 245 are each divided into a plurality of unit cells, each unit cell having a contact 230 to drain region 225 and 245, respectively.

In the structure shown in FIG. 11, the absence of an integrated protection allows the transistor devices to be scaled independent of the protection circuits, e.g., independent of the ESD protection diode. The absence of an integrated protection circuit such as a diode also allows both sides of drains 225 and 245 of respective PMOS transistor devices to be exploited. Thus, for each contact 230 to a unit cell of drain region 225 and 245, respectively, there is twice the width (2W) for a given capacitance C. Thus, a doubling of the width to capacitance ratio is obtained over the prior art structure shown in FIG. 2.

Figure 12:
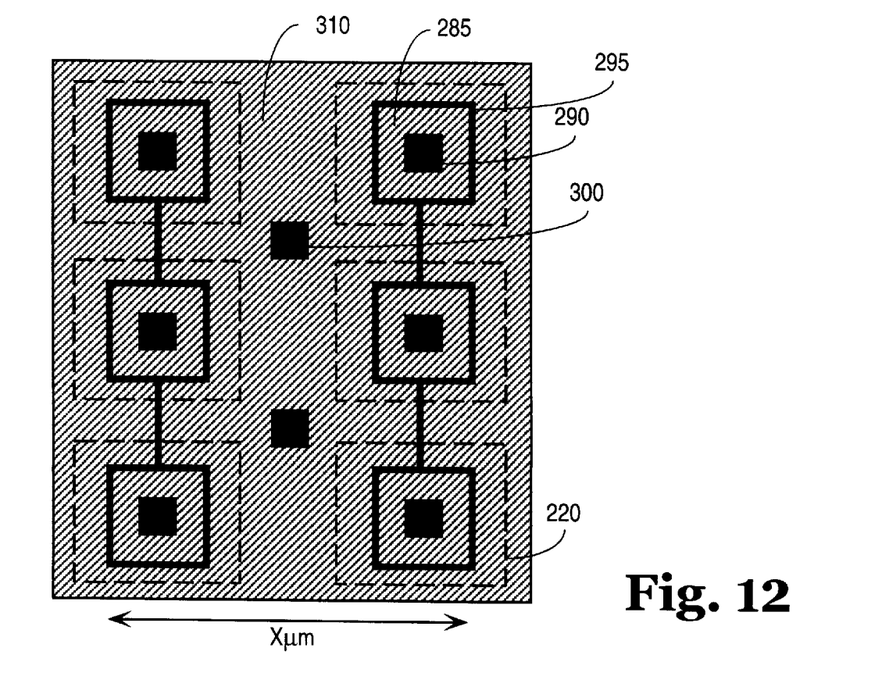
FIG. 12 schematically illustrates a layout of a second embodiment of a performance circuit of a partitioned integrated circuit in accordance with the invention.

FIG. 12 shows a layout of a second embodiment of the performance portion of the partitioned integrated circuit of the invention. In FIG. 12, individual unit cells 280 include a p-type doped region 285 and contact 290 in n-well 220. Here again, a unit cell is that minimum amount of p-typed doped area that will support a contact. Overlying and surrounding the periphery of unit cell 280 is polysilicon gate 295. In this case, p-type doped regions 285 of unit cells 280 serve as drain regions for the PMOS FET device. Surrounding drain region 285 of unit cells 280 is p-type source region 310. Summarizing the unit cell 280 structure as a waffle structure, one drain contact 290 serves four sides. Accordingly, the width to capacitance ratio is 4W/C, a gain of four times the width to capacitance ratio over prior art structures such as described in FIG. 2 and the accompanying text.

The waffle transistors described above can be analytically or empirically modeled similar to prior art "Ladder" transistors such as shown in FIG. 2 and the accompanying text. For a right angle edged waffle MOSFET, the width is four times the inner width (assuming small gate lengths). If the corners are not sharp and a right triangle is placed at each corner, the effective width of the corners is diminished, such that the effective width is estimated by the known relationship:

$$\Delta W_{eff} = \frac{4L}{\pi} \ln \frac{LW_s}{L}$$

where $W_S$ is the length of the triangle's side. Straight gate edges should be added to this number.

Figure 13:
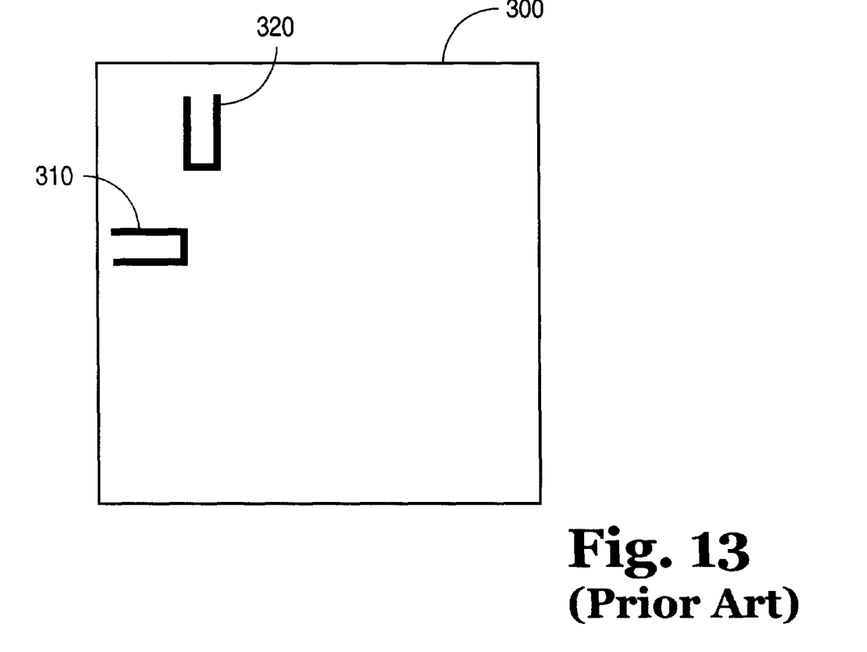
FIG. 13 schematically illustrates a top view of a layout of a portion of an integrated circuit chip showing ladder type I/O circuits at a corner.
Figure 14:
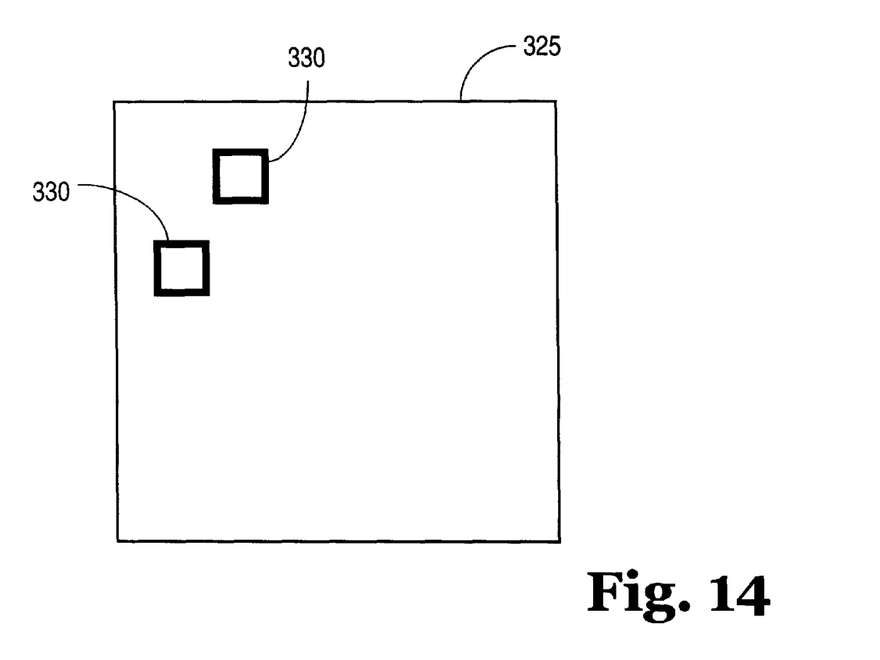
FIG. 14 schematically illustrates a top view of a layout of a portion of an integrated circuit chip showing waffle type I/O circuits at a corner.

Another advantage of the waffle design of transistors is that asymmetries arising in I/O circuits due to chip layout are avoided. This occurs generally on the corners of a chip where ladder type devices of the prior art that were laid out in one direction changed direction at the corner, for example, going from vertical to horizontal. FIG. 13 shows the example of a ladder type transistor layout in the corner showing horizontal ladder I/O device 310 and vertical ladder I/O device 320. The changing of direction can lead to small asymmetries in the device that in turn lead to skews in timing. FIG. 14 shows the waffle transistor design of the invention wherein symmetric I/O devices are used in I/O circuits eliminating asymmetries in corners of the chip and therefore benefiting the timing margin.

By improving the drain width to capacitance ratio in accordance with the embodiments described above, the capacitance on, for example, an I/O pad is reduced for the same current drive capability. This reduction in capacitance leads to faster transition times and enhances bus performance (e.g., bus speed). Further, the four-fold symmetry of the waffle FET design, in particular, reduces effects due to orientation, leading to less skew in the timing of the circuit performance.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An integrated circuit comprising:
   a performance circuit occupying a first area of an integrated circuit substrate; and
   a protection circuit partitioned from the performance circuit and having a size commensurate with dissipating an amount of predetermined charge incident on the performance circuit and occupying a second area of an integrated circuit substrate separate from the first area.

2. The integrated circuit of claim 1, wherein the performance circuit comprises an input/output circuit to one of accept and drive a signal external to the integrated circuit.

3. The integrated circuit of claim 1, wherein the partitioned protection circuit is a diode.

4. The integrated circuit of claim 1, wherein the partitioned protection circuit includes:
   a diode comprised of a unit block of a doped region of the integrated circuit substrate occupying an area of the substrate sufficient to support a contact to the doped region;
   a junction region of the integrated circuit substrate surrounding the doped region; and
   a contact to the doped region.

5. The integrated circuit of claim 4, the doped region being a first doped region of a first dopant in a well of the substrate, the well being doped with a first concentration of a second dopant and the junction region separating the first doped region from the well, the diode comprising a third doped region in the well adjacent the junction region, the third doped region doped with a second concentration of the second dopant.

6. The integrated circuit of claim 5, wherein the diode is comprised of a plurality of unit blocks, each of the plurality of unit blocks having a first doped region of a first dopant in a well of the substrate and a junction region separating each of the first doped regions from the well.

7. The integrated circuit of claim 6, wherein the third doped region surrounds the junction.

8. The integrated circuit of claim 1, wherein the performance circuit includes:
   a partitioned driver having a unit transistor having a drain region comprised of a unit block of a doped region of the integrated circuit substrate occupying an area of the substrate sufficient to support a contact to the doped region;
   a gate region of the integrated circuit substrate surrounding the drain region; and
   a contact to the doped region.

9. The integrated circuit of claim 8, the doped region having a first dopant in a well of the substrate, the well being doped with a second dopant, the transistor comprising a source region having the first dopant in the well separated from the drain region by the gate.

10. The integrated circuit of claim 9, wherein the performance circuit includes a plurality of unit transistors.

11. A buffer comprising:
    complimentary metal oxide semiconductor (CMOS) device occupying a first area of an integrated circuit substrate; and
    a protection circuit including a diode partitioned from the CMOS device and occupying a second area of an integrated circuit substrate separate from the first area, the diode having a size commensurate with dissipating an amount of predetermined charge incident on the performance circuit.

12. The buffer of claim 11, wherein the buffer is one of an input buffer, an output buffer, and an input/output buffer.

13. The buffer of claim 11, wherein the CMOS device includes a p-channel device and the diode is partitioned from the p-channel device.

14. The buffer of claim 13, the diode including:
    a diode comprised of a plurality of unit blocks, each of the plurality of unit blocks having a p-doped region in an n-well of the substrate and occupying an area of the substrate sufficient to support a contact to the p-doped region;
    a junction region separating each of the p-doped regions from the n-well; and
    a contact to each of the plurality of unit blocks.

15. The buffer of claim 14, the diode further comprising an n-doped region adjacent the junction of each p-doped region, the n-doped region doped with a dopant concentration greater than a dopant concentration of the n-well.

16. The buffer of claim 15, wherein the n-doped region surrounds the junction.

17. The buffer of claim 11, wherein the CMOS device comprises:
    a unit transistor having a drain region comprised of a unit block of a p-doped region in a well of the integrated circuit substrate, the unit block occupying an area of the substrate sufficient to support a contact to the p-doped region;
    a gate region of the integrated circuit substrate surrounding the p-doped region; and
    a contact to the p-doped region.

18. The buffer of claim 17, the well being doped with a first concentration of an n-type dopant, the unit transistor comprising a p-doped source region in the well separated from the drain region by the gate.

19. The buffer of claim 18, wherein the complimentary metal oxide semiconductor device comprises a plurality of unit transistors.

* * * * *